(12) United States Patent
Lee

(10) Patent No.: US 11,711,000 B2
(45) Date of Patent: Jul. 25, 2023

(54) HAIRPIN TYPE STATOR INSPECTION APPARATUS AND METHOD FOR TESTING THE SAME

(71) Applicants: HYUNDAI MOTOR COMPANY, Seoul (KR); KIA MOTORS CORPORATION, Seoul (KR)

(72) Inventor: Seunghwan Lee, Gwangmyeong-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 302 days.

(21) Appl. No.: 17/107,365

(22) Filed: Nov. 30, 2020

(65) Prior Publication Data

US 2021/0288563 A1 Sep. 16, 2021

(30) Foreign Application Priority Data

Mar. 12, 2020 (KR) ........................ 10-2020-0030501

(51) Int. Cl.
*H02K 15/02* (2006.01)
*G01R 31/34* (2020.01)
*H02K 15/00* (2006.01)

(52) U.S. Cl.
CPC ............ *H02K 15/02* (2013.01); *G01R 31/34* (2013.01); *H02K 15/0062* (2013.01)

(58) Field of Classification Search
CPC .. H02K 15/02; H02K 15/0062; H02K 15/064; H02K 3/505; H02K 11/20; G01R 31/34; G01R 31/72; G01R 31/346; G01R 1/0416; G01B 11/00; G01N 21/8851; G01N 21/892; G01N 21/95

See application file for complete search history.

(56) References Cited

U.S. PATENT DOCUMENTS

| 2003/0038652 | A1* | 2/2003 | McGough | G01R 31/34 324/765.01 |
| 2004/0200059 | A1* | 10/2004 | Ema | H01R 43/052 29/748 |
| 2013/0104381 | A1* | 5/2013 | Guercioni | H02K 15/0081 29/559 |
| 2017/0349383 | A1* | 12/2017 | Myers | B65G 47/71 |
| 2020/0099281 | A1* | 3/2020 | Shimmei | H02K 15/0062 |
| 2020/0099327 | A1* | 3/2020 | Nashiki | H02K 3/28 |
| 2020/0319142 | A1* | 10/2020 | Kosaka | G01N 27/87 |

* cited by examiner

*Primary Examiner* — Robert H Kim
*Assistant Examiner* — Christopher J Gassen
(74) *Attorney, Agent, or Firm* — Lempia Summerfield Katz LLC

(57) ABSTRACT

A hairpin type stator inspection apparatus is provided for testing performance of a stator wound with hairpin type stator coils. The hairpin type stator inspection apparatus includes: a conveyor provided on a frame for transferring the stator including a plurality of stator terminals along a predetermined path: a plurality of clamp terminals, which are installed to be movable to the frame by a driver in up and down, front and rear, and left and right directions in order to clamp the stator terminals: a controller that applies a driving control signal to the driver to change a position of the clamp terminals according to a position of the stator terminals; and an inspection portion that applies power to the stator terminals through the clamp terminals and inspects the electrical circuit of the stator.

16 Claims, 6 Drawing Sheets

HAIRPIN TYPE STATOR INSPECTION APPARATUS AND METHOD FOR TESTING THE SAME

CROSS-REFERENCE TO RELATED APPLICATION

This application claims priority to and the benefit of Korean Patent Application No. 10-2020-0030501 filed in the Korean Intellectual Property Office on Mar. 12, 2020, the entire contents of which are incorporated herein by reference.

BACKGROUND

(a) Field of the Disclosure

An embodiment of the present disclosure relates to a system for manufacturing a driving motor, and more particularly, to a hairpin type stator inspection apparatus and method for testing the performance of a stator wound with a hairpin-type stator coil.

(b) Description of the Related Art

In general, hybrid vehicles or electric vehicles called environment-friendly vehicles employ a technology that generates driving torque by a drive motor. As a part of reducing the weight and volume of vehicles and parts, automakers and environment-friendly parts manufacturers are applying a drive motor with a stator wound with a hairpin-type stator coil.

The hairpin winding type stator is manufactured through a process of inserting hairpin type stator coils into slots of a stator core and welding the ends of the stator coils.

In the process, the three-phase or four-phase coil lead portions are drawn from the stator cons, and terminals are connected to each coil lead portion.

The hairpin winding type stator manufactured as described above connects a test terminal of a test facility to each terminal in a separate test process, applies power to the terminal through the test terminal, and checks the performance of the stator.

However, in the related art, since inspection terminals of an inspection facility and the terminals of the stator are manually connected, workability is deteriorated, and the working time of connecting the terminals and the inspection terminals as a whole is excessive. Furthermore, the connection work between the test terminals and the terminals may cause damage to the stator during the connection process.

In addition, conventionally, when the test terminals of the test facility are deformed or the terminals of the stator are unevenly arranged, it is difficult to ensure the reliability of contact between the test terminals and the terminals. Thus, the reliability of the performance test may be degraded.

The above information disclosed in this Background section is only for enhancement of understanding of the background of the disclosure, and therefore it may contain information that does not form the prior art that is already known in this country to a person of ordinary skill in the art.

SUMMARY

The present disclosure has been made in an effort to provide a hairpin type stator inspection apparatus and method having advantages of automatically connecting test terminals for applying power to terminals of a stator in an inspection process of the stator, and to inspect the hairpin-type stator to test the electrical performance of the stator.

An embodiment of the present disclosure relates to a hairpin type stator inspection apparatus for testing performance of a stator wound with hairpin type stator coils. The hairpin type stator inspection apparatus according to an embodiment of the present disclosure may include: a conveyor provided on a frame for transferring the stator including a plurality of stator terminals along a predetermined path: a plurality of damp terminals, which are installed to be movable to the frame by a driver in up and down, front and rear, and left and right directions in order to damp the stator terminals: a controller that applies a driving control signal to the driver to change a position of the damp terminals according to a position of the stator terminals; and an inspection portion that applies power to the stator terminals through the damp terminals and inspects the electrical circuit of the stator.

The inspection apparatus may further include a vision sensor that is installed in the frame, photographs the stator terminals, and outputs vision data to the controller.

The damp terminals may damp the stator terminals provided on coil lead portions of four phases (U, V, W, and N) in the stator.

The inspection apparatus may further include a ground terminal installed to be movable to the frame by the driver and grounded to the stator core of the stator.

The controller may apply a first driving control signal to the driver to move the damp terminals to a predetermined position corresponding to the stator terminals.

The controller may calculate position data of the stator terminals by analyzing the vision data acquired from the vision sensor, and the controller may apply a second driving control signal to the driver according to the position data.

The driver may include a number of servomotors that perform forward/reverse operation according to up and down, front and rear, and left and right directions of each clamp terminal.

The inspection apparatus may further include a barcode scanner installed on the frame to recognize a barcode attached to the stator.

The inspection apparatus may further include a stator detecting sensor installed in the frame to detect the stator transferred to a predetermined position by the conveyor and output a detection signal to the controller.

The inspection apparatus may further include attachment members installed on the conveyor to fix the stator.

The inspection apparatus may further include a base member installed on the conveyor to support a lower end of the stator, and the attachment members may be installed on the base member so that they can be moved back and forth through an operation cylinder.

An embodiment of the present disclosure relates to a method for testing performance of a stator wound with hairpin type stator coils. The method according to an embodiment of the present disclosure may include: positioning the stator at a predetermined position through a conveyor; applying a first driving control signal to a driver by a controller, and moving clamp terminals to a predetermined position corresponding to stator terminals; photographing the stator terminals of the stator and outputting vision data to the controller; and analyzing, by the controller, the vision data to calculate position data of the damp terminals, applying a second driving control signal corresponding to the position data to the driver, and moving the clamp terminals according to the position data.

The stator terminals may be clamped through the clamp terminals, power may be applied to the stator terminals through the clamp terminals, and the electrical circuit of the stator may be inspected through an inspection portion.

An inspection result stored in the inspection portion may be transmitted to a main control unit.

In the positioning of the stator, a barcode attached to the stator may be scanned with a barcode scanner, and product information of the stator may be output to the controller.

In the positioning of the stator, the stator conveyed by a conveyor may be detected through a stator detecting sensor, a detection signal may be output to the controller, and the conveyor may be stopped by the controller according to the detection signal.

In the positioning of the stator, the stator may be fixed through attachment members mounted on a base member on the conveyor.

According to an embodiment of the present disclosure, the position of the clamp terminals is adjusted according to the position of the stator terminals, and the clamp terminals can be automatically connected to the stator terminals. Therefore, even if the assembled position deviation of stator terminals occurs; the reliability of the stator inspection can be improved.

In addition, effects that can be obtained or predicted by the embodiments of the present disclosure are disclosed directly or implicitly in the detailed description of the embodiments of the present disclosure. In other words, various effects predicted according to an embodiment of the present disclosure are disclosed within a detailed description below.

BRIEF DESCRIPTION OF THE DRAWINGS

These drawings are for reference only in describing embodiments of the present disclosure, and therefore, the technical idea of the present disclosure should not be limited to the accompanying drawings.

DETAILED DESCRIPTION OF THE EMBODIMENTS

Figure 1:
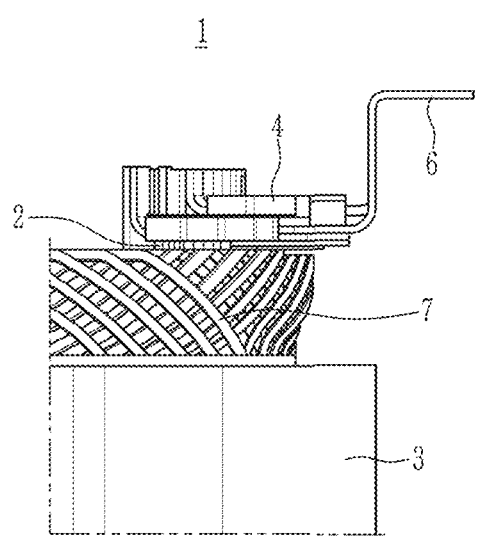
FIG. 1 and FIG. 2 are a front view and a plan view, respectively, showing a stator of a hairpin winding type applied to an embodiment of the present disclosure.

The present disclosure is described more fully hereinafter with reference to the accompanying drawings, in which embodiments of the disclosure are shown. As those having ordinary skill in the art would realize, the described embodiments may be modified in various different ways, all without departing from the spirit or scope of the present disclosure.

In order to clearly describe the present disclosure, parts irrelevant to the description have been omitted, and the same reference numerals are assigned to the same or similar components throughout the specification.

Since the size and thickness of each component shown in the drawings are arbitrarily shown for convenience of description, the present disclosure is not necessarily limited to those shown in the drawings, and the thickness is enlarged to clearly express various parts and regions.

In addition, in the following detailed description, the names of the configurations are divided into first, second, and the like to distinguish the configurations in the same relationship and are not necessarily limited to the order in the following description.

Throughout the specification, unless explicitly described to the contrary, the word "comprise", and variations such as "comprises" or "comprising", should be understood to imply the inclusion of stated elements but not the exclusion of any other elements.

In addition, terms such as . . . unit, . . . means, . . . part, . . . member, and the like described in the specification mean a unit of a comprehensive structure that performs at least one function or operation.

Figure 2:
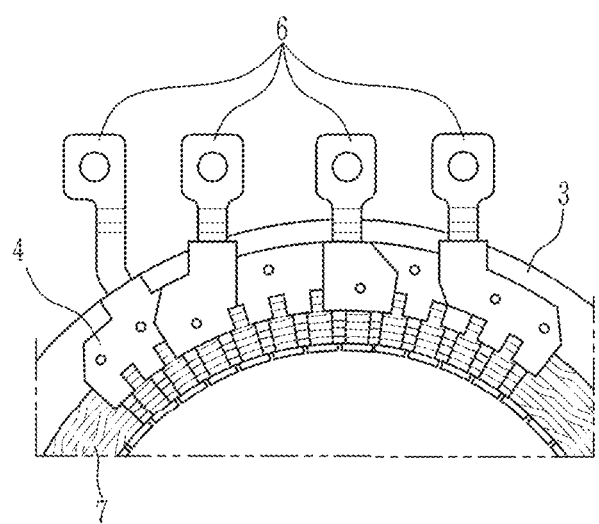

FIG. 1 and FIG. 2 are a front view and a plan view, respectively, showing a stator of a hairpin winding type applied to an embodiment of the present disclosure.

Referring to FIG. 1 and FIG. 2 according to an embodiment of the present disclosure, a hairpin winding type stator 1 may be applied to a drive motor for a hybrid vehicle and/or electric vehicle as an environment-friendly vehicle that obtains driving torque by electrical energy. The drive motor may include a stator 1 according to an embodiment of the present disclosure, and a rotor (not shown in the drawing) that is disposed within the stator 1 with a certain air gap.

The stator 1 includes a stator core 3 in which a number of electrical steel sheets are stacked. The stator core 3 has a hairpin-type stator coil 7 (commonly referred to as a conductor, segment coil or flat coil in the industry) through a number of slots.

The stator coils 7 are provided in a U-shaped or V-shaped hairpin type with a pair of legs, for example, and may be provided as a rectangular cross-section square coil.

These hairpin-type stator coils 7 are inserted into the slots of the stator core 3. A pair of legs protrude through the bottom of the slots. The legs of stator coils 7 can be welded to form an electrically connected circuit.

The stator 1 according to an embodiment of the present disclosure includes coil lead portions 2 of 4 phases (U, V, W, and N phase) drawn out from stator coils 7 and stator terminals 6 connected to the coil lead portions 2 through bus bar 4. As shown in FIG. 1, the terminals 6 are positioned on the upper side of the stator core 3.

The position of the terminals 6 are different from each other according to the product specifications of the stator 1, and each is positioned at a virtual predetermined position based on the stator core 3.

Hereinafter, the transfer direction of the stator 1 transferred along a predetermined transfer path is defined as the front and rear direction. The direction vertically crossing the front and rear direction in the plane direction is the left and right direction and the direction vertically crossing the plane direction is defined as the up and down directions.

Further, the end (one/one end or the other/one end) in the following may be defined as either end, and a certain part (one/one end or the other/one end) including the end can also be defined.

An inspection apparatus 100 of a hairpin type stator according to an embodiment of the present disclosure automatically connects test terminals to apply power to the terminals 6 in the test process of the stator 1 and can test the electrical performance of the stator 1.

Figure 3:
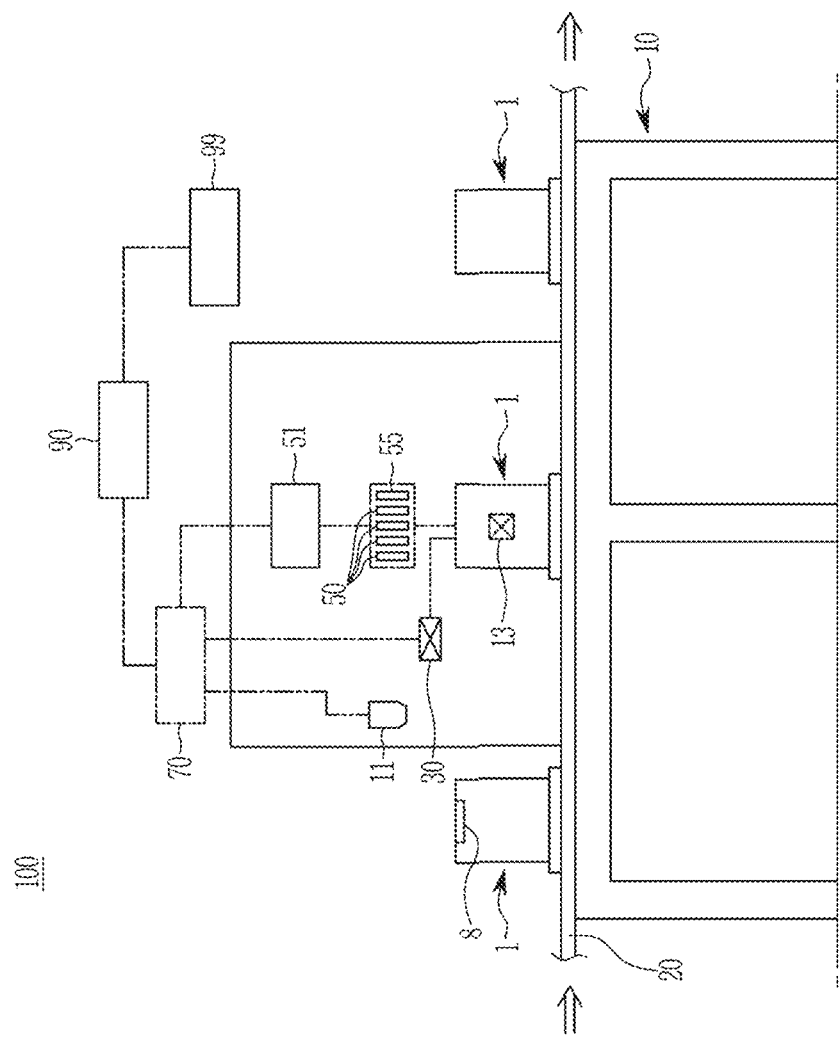
FIG. 3 is a drawing schematically showing an inspection apparatus for a hairpin winding type stator according to an embodiment of the present disclosure.

FIG. 3 is a drawing schematically showing an inspection apparatus for a hairpin winding type stator according to an embodiment of the present disclosure.

Referring to FIGS. 1-3, the inspection apparatus 100 of the hairpin type stator according to an embodiment of the present disclosure includes a frame 10, a conveyor 20, a vision sensor 30, a plurality of clamp terminals 50, a controller 70, and an inspection portion 90.

In an embodiment of the present disclosure, the frame 10 is to be installed with various constituent elements to be described further below and is provided on the floor of the process work site. This frame 10 may include one frame or two or more frames connected to each other.

In addition, the frame 10 may include various accessory elements such as brackets, bars, rods, plates, blocks, ribs, and collars for supporting various constituent elements.

However, since the above-described accessory elements are for installing each constituent element to be described further below in frame 10, in an embodiment of the present disclosure, the above-described accessory elements are collectively referred to as frame 10 except for exceptional cases.

In an embodiment of the present disclosure, the conveyor 20 is for transporting the stator 1, which has been assembled in the stator assembly process, along a predetermined transport path. The conveyor 20 is provided on the frame 10 in the front and rear direction according to the transfer direction of the stator 1.

The conveyor 20 is a conveyor device of a known technology, supports stators 1 at predetermined intervals, and is provided to be driven through a conveyor drive unit.

In an embodiment of the present disclosure, a barcode scanner 11 installed in the frame 10 is included. The barcode scanner 11 is installed on the entry side of the stator 1 by the conveyor 20 in the frame 10.

The barcode scanner 11 recognizes a barcode 8 attached to the stator 1. The barcode scanner 11 scans the barcode 8 and can output product information of the stator 1 to the controller 70, as explained below.

The product information of the stator 1 may include data on the number, spacing, length, height, and front/rear/left/right direction positions of the number of terminals 6 per model and specification of each stator 1.

Since this barcode scanner 11 is made of a barcode reader device of a known technology well known in the art, a more detailed description of its configuration is omitted in this specification.

Furthermore, in an embodiment of the present disclosure the inspection apparatus 100 further includes a stator detecting sensor 13 installed in the frame 10. The stator detecting sensor 13 may detect the stator 1 transferred to a predetermined position by the conveyor 20 and output the detection signal to the controller 70. For example, the stator detecting sensor 13 may include a known infrared sensor.

Figure 4:
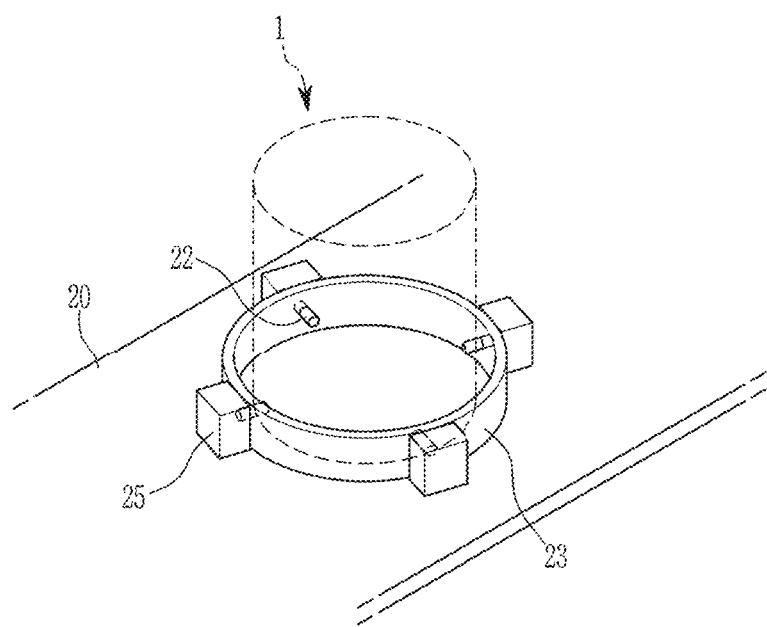
FIG. 4 is a drawing showing an attachment member applied to an inspection apparatus of a hairpin winding type stator according to an embodiment of the present disclosure.

FIG. 4 is a drawing showing an attachment member applied to an inspection apparatus of a hairpin winding type stator according to an embodiment of the present disclosure. The hairpin type stator inspection apparatus 100 includes a base member 23 installed on the conveyor 20 and a plurality of attachment members 22 installed on the base member 23.

The base member 23 supports a lower part of the stator 1 and is fixedly installed on an upper surface of the conveyor 20 at predetermined intervals along the transfer direction of the stator 1. The attachment members 22 are for fixing the stator 1 supported on the base member 23 and are installed on the base member 23 to allow radial reciprocal movement.

The attachment members 22 may be attach blocks made of rubber material and installed so that they can be moved back and forth radially by a known technology operation of a cylinder 25.

Referring to FIGS. 1-3, in an embodiment of the present disclosure, the vision sensor 30 is installed in the frame 10. The vision sensor 30 may photograph the terminal 6 of the stator 1 transferred to a predetermined position through the conveyor 20 and output vision data to the controller 70.

Since the vision sensor 30 is made of a vision system of a known technology including a camera unit and an illumination unit, a more detailed description of the configuration in this specification is omitted.

Figure 5:
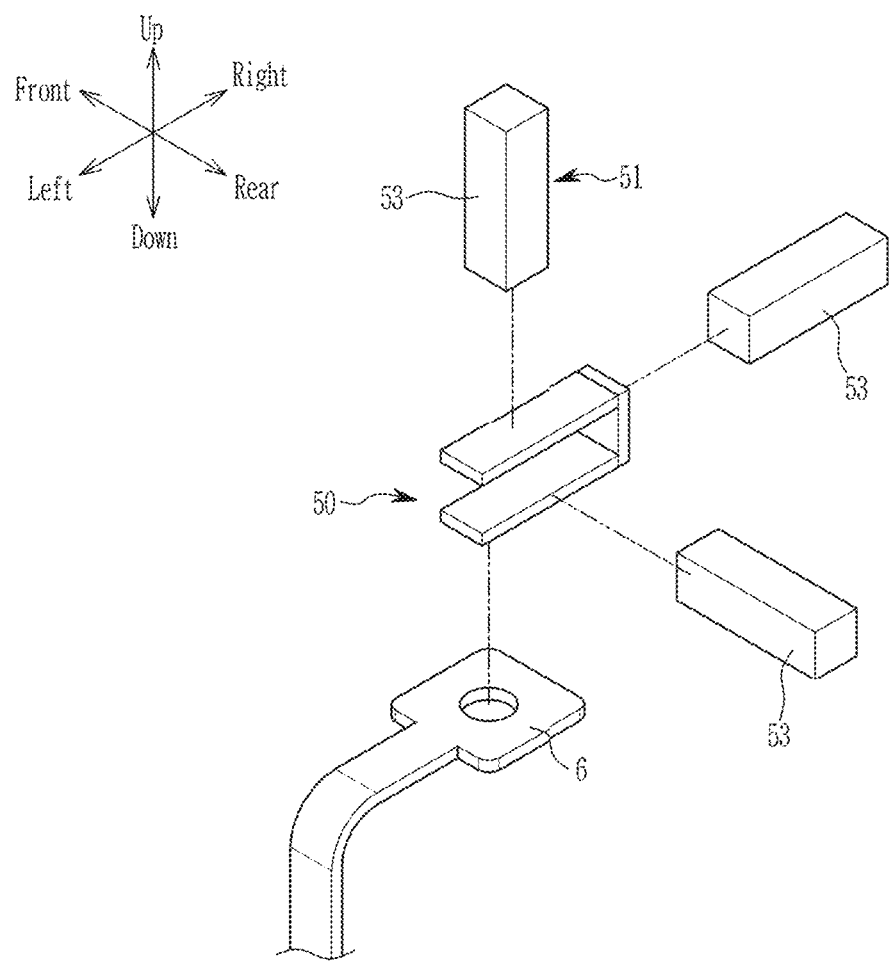
FIG. 5 is a drawing schematically showing a clamp terminal and a driver applied to the inspection apparatus of a hairpin winding type stator according to an embodiment of the present disclosure.

FIG. 5 is a drawing schematically showing a clamp terminal and a driver applied to the inspection apparatus of a hairpin winding type stator according to an embodiment of the present disclosure.

Referring to FIGS. 1-5, in an embodiment of the present disclosure, the plurality of clamp terminals 50 is provided as a test terminal or connector terminal that can be electrically connected to the terminals 6 of the stator 1.

The clamp terminals 50 are installed on the frame 10 so that they can be moved up and down, forward and backward, and left and right. In addition, the clamp terminals 50 may be provided in the form of an electric finger operated by, for example, an electrical signal. The clamp terminals 50 can be moved in multiple directions (up/down, front/rear and left/right) by driver 51 installed in the frame 10.

The driver 51 may include a plurality of servomotors 53 that respectively apply forward and backward operating forces along the up and down, front and rear, and left and right directions of each clamp terminal 50. The servomotors 53 are equipped with a known technology servomotor capable of servo control of rotating direction and rotation speed.

In addition, the driver 51 may further include a known technology lead screw and guide structure (not shown in the drawing) for converting rotational motion of servomotors 53 into straight line motion.

In an embodiment of the present disclosure, the controller 70 may control the overall operation of the inspection apparatus 100 and may be implemented as at least one control processor operated by a predetermined program. The controller 70 may include a series of instructions and the like for performing the content according to an embodiment of the present disclosure.

The controller 70 may apply a predetermined control signal to the conveyor driving device and the driver 51 as described above. The controller 70 may control driving of the conveyor 20 and the driver 51.

In other words, the controller 70 may apply a driving control signal for stopping the traveling of conveyor 20 according to the transfer position of the stator 1 to the conveyor driving device. The controller 70 may apply a driving control signal to the driver 51 to change the position of clamp terminals 50 according to the distance, length, height and position of the terminals 6.

Specifically, the controller 70 may apply a first driving control signal to the driving unit 51 to move the clamp terminals 50 to a preset position (pre-teaching position) according to the product information of the stator 1 acquired through the barcode scanner 11, i.e., position information of the terminals 6.

Furthermore, the controller 70 can determine the actual position data of the terminals 6 according to the assembled distribution of the terminals 6 by analyzing the vision data acquired through the vision sensor 30 mentioned above. And, the controller 70 can apply a second drive control signal to the driver 51 to move the clamp terminals 50 to a position suitable for the position data.

In an embodiment of the present disclosure, the inspection portion 90 applies power to the terminals 6 through the clamp terminals 50 by the controller 70 for inspecting the electrical circuit of the stator 1.

The inspection portion 90 can derive an inspection result of the stator 1, for example, the current value of each phase of the stator 1 through the terminals 6, or can determine whether or not the stator 1 is defective, and can store the inspection result. The inspection or test result can be transferred to the main control unit 99 (for example, the main control PC).

The drawing reference numeral 55, which is not described in the drawings, denotes a known technology ground terminal grounded to the stator core 3 of the stator 1. The ground terminal 55 can be installed to be movable in multi-axis directions on the frame 10 by the driver 51 mentioned above.

Hereinafter, the operation of the hairpin type stator inspection apparatus 100 according to an embodiment of the present disclosure configured as described above and a stator inspection method using the inspection apparatus 100 is described in detail with reference to the drawings described above.

Figure 6:
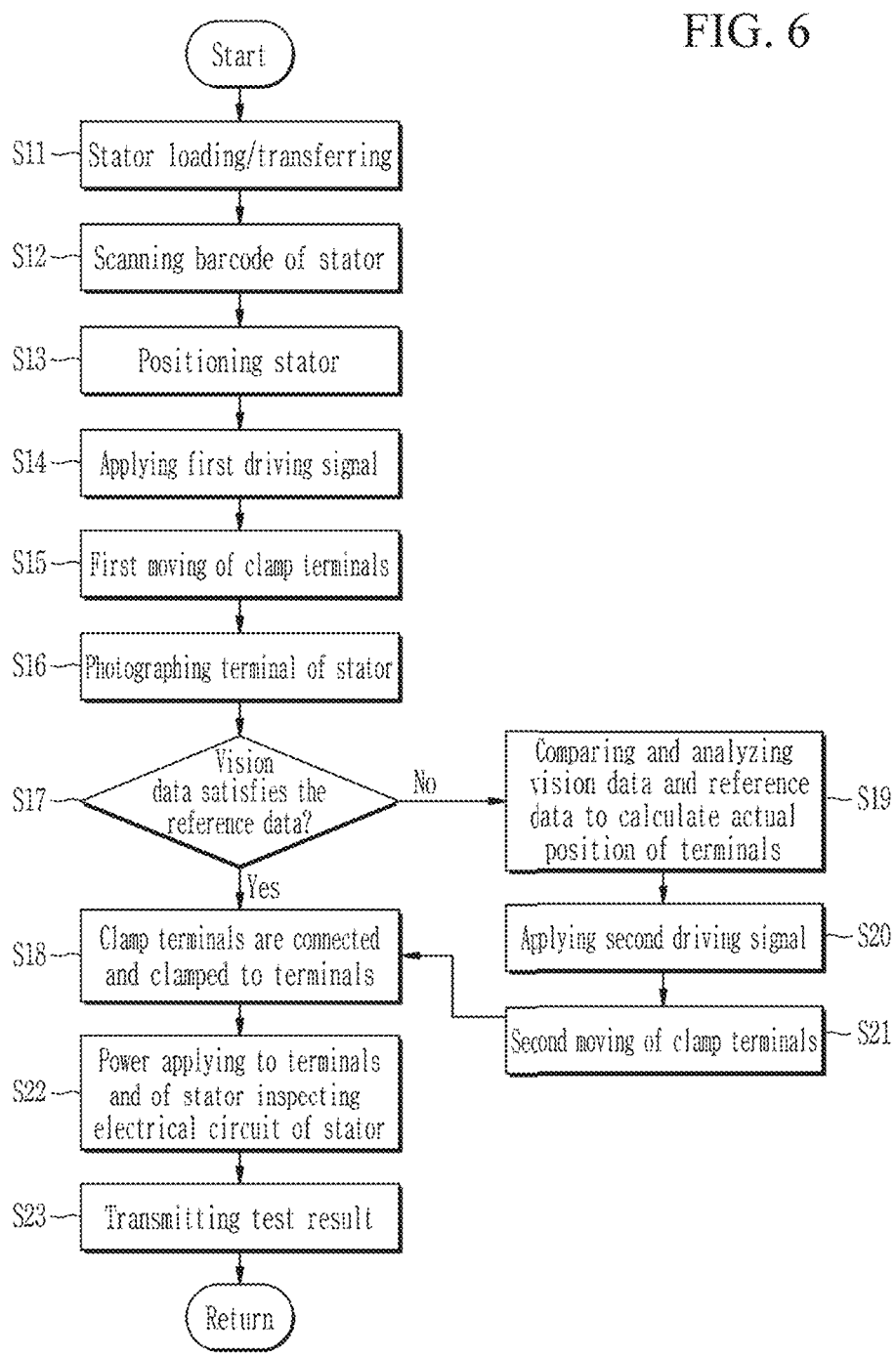
FIG. 6 is a flowchart showing an inspection method of the hairpin winding type stator according to an embodiment of the present disclosure.

FIG. 6 is a flowchart showing an inspection method of the hairpin winding type stator according to an embodiment of the present disclosure.

Referring to the drawings, in an embodiment of the present disclosure, the stator 1 assembled in the stator assembly process is loaded onto the conveyor 20 of the frame 10. The stator 1 is transferred along a predetermined transfer path through the conveyor 20 (step S11).

In this process, the stator 1 is mounted on the base member 23 on the conveyor 20, the attachment member 22 is radially moved forward by the operation of the cylinder 25, and the lower part of the stator 1 is fixed to the base member 23 through the attachment member 22.

In the above-described process, the barcode 8 attached to the stator 1 at the entry side of the stator 1 of the conveyor 20 is scanned by the barcode scanner 11 and the product information of the stator 1 is output to the controller 70 (step S12).

Next, in an embodiment of the present disclosure, the stator 1 is correctly positioned at the predetermined position on the transfer path of the stator 1 through the conveyor 20 (step S13).

In the above process, the stator 1 conveyed by the conveyor 20 is detected through the stator detecting sensor 13 and the detection signal is output to the controller 70. Then, according to the detection signal, a control signal is applied to the conveyor driving device by the controller 70 to stop the conveyor 20. The stator 1 can be correctly positioned at a predetermined position.

In this state, the controller 70 applies the first driving signal corresponding to the product information of the stator 1, i.e., the position information of the terminals 6, acquired through the barcode scanner 11 to the driver 51 (step S14).

Due to the position information of the terminals 6, by driving the servomotors 53, the clamp terminals 50 and the ground terminal 55 are moved to a predetermined position (pre-teaching position) along the up-down, forward-backward and left-right directions (step S15).

Next, the vision sensor 30 photographs the terminals 6 of the stator 1 and outputs the vision data to the controller 70 (step S16).

Then, the controller 70 compares and analyzes the vision data acquired from the vision sensor 30 with the reference data. If it is determined that the vision data satisfies the reference data (step S17), a predetermined control signal is applied to the clamp terminals 50.

The vision data satisfying the reference data means being within an error of a setting range. The error in the setting range means an error within a range in which the clamp terminals 50 can damp the terminals 6 of the stator 1. The error may be set in advance.

Thus, the clamp terminals 50 are connected to the terminals 6 and clamped to the terminals 6 (step S18). The reference data means predetermined position information of the terminals 6 due to the product information of the stator 1.

On the other hand, if it is determined that the vision data does not satisfy the reference data in step S17, the controller 70 compares and analyzes the vision data and the reference data to calculate the actual position data of the terminals 6 according to the assembled distribution of the terminals 6 (step S19).

Then, the controller 70 applies the second driving control signal corresponding to the actual position data to the driver 51 (step S20). Accordingly, by driving the servomotors 53, the clamp terminals 50 are moved to a position corresponding to the actual position data in the up-down, forward-backward and left-right directions (step S21). Therefore, as in step S18, connection and clamping of the clamp terminals 50 and the terminals 6 are performed.

In this state, power is applied to the terminals 6 through the clamp terminals 50 by controller 70, and the electrical circuit of the stator 1 is inspected through the inspection portion 90 (step S22).

Next, the test results such as the current value of each phase of the stator 1 through the terminals 6 and whether stator 1 is defective are stored in the inspection portion 90. Simultaneously, the test results are transmitted to the main control unit 99 (step S23).

Therefore, according to the inspection apparatus 100 and method of the hairpin winding type stator according to an embodiment of the present disclosure as described so far, as a test terminal (connector) to apply power to the terminals 6 of the stator 1 in the test process of the stator 1, the damp terminals 50 are automatically connected to the terminals 6, and electrical performance of the stator 1 can be tested.

Accordingly, in an embodiment of the present disclosure, the position of the damp terminals 50 is adjusted according to the position of the terminals 6. The clamp terminals 50 can be automatically connected to the terminals 6, so even if the assembled position deviation of the terminals 6 occurs it can improve the reliability of electrical inspection of the stator 1.

Furthermore, in an embodiment of the present disclosure, the inspection work time for inspecting the electrical circuit of the stator 1 can be drastically reduced. Inspection workability can be improved by reducing inspection man hours and inspection work stability may be secured. It is also possible to minimize the damage of the terminals 6.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

DESCRIPTION OF SYMBOLS

1: stator
2: coil lead portion
3: stator core
4: bus bar
6: terminal
7: stator coil
8 barcode
10: frame
11: barcode scanner
13: stator detecting sensor
20: conveyor
21: attachment member
23: base member
25: operation cylinder
30: vision sensor
50: clamp terminal
51: driver
53: servomotor
55: ground terminal
70: controller
90: inspection portion
99: main control unit
100: inspection apparatus

What is claimed is:

1. A hairpin type stator inspection apparatus for testing performance of a stator wound with hairpin type stator coils, the hairpin type stator inspection apparatus comprising:
   a conveyor provided on a frame for transferring the stator, which includes a plurality of stator terminals along a predetermined path;
   a plurality of clamp terminals which are installed to be movable in a plurality of directions relative to the frame by a driver, the plurality of clamp terminals being configured to clamp the stator terminals;
   a controller that applies a driving control signal to the driver to change a position of the clamp terminals according to a position of the stator terminals; and
   an inspection portion that applies power to the stator terminals through the clamp terminals and inspects an electrical circuit of the stator
   wherein the driver comprises three servomotors orthogonal to each other that perform one dimensional movement operations in a plurality of directions relative to the frame for each clamp terminal.

2. The inspection apparatus of claim 1, further comprising a vision sensor that is installed to be operably connected with the frame, photographs the stator terminals, and outputs vision data to the controller.

3. The inspection apparatus of claim 2, wherein the controller applies a first driving control signal to the driver to move the clamp terminals to a predetermined position corresponding to the stator terminals.

4. The inspection apparatus of claim 3, wherein:
   the controller calculates position data of the stator terminals by analyzing the vision data acquired from the vision sensor; and
   the controller applies a second driving control signal to the driver according to the position data.

5. The inspection apparatus of claim 1, wherein the clamp terminals clamp the stator terminals, wherein the stator terminals are provided on coil lead portions of four phases in the stator.

6. The inspection apparatus of claim 1, further comprising a ground terminal installed to be movable relative to the frame by the driver and grounded to a stator core of the stator.

7. The inspection apparatus of claim 1, further comprising a barcode scanner installed on the frame to recognize a barcode attached to the stator.

8. The inspection apparatus of claim 1, further comprising a stator detecting sensor installed to be operably connected with the frame, wherein the stator detecting sensor detects the stator, which is transferred to a predetermined position by the conveyor and wherein the stator detecting sensor outputs a detection signal to the controller.

9. The inspection apparatus of claim 1, further comprising attachment members installed on the conveyor to fix the stator to the conveyor.

10. The inspection apparatus of claim 9, further comprising a base member installed on the conveyor to support a lower end of the stator, and
   wherein the attachment members are installed on the base member so that the attachment members can be moved toward and away from the stator through an operation cylinder.

11. A method for testing performance of a stator wound with hairpin type stator coils, the method comprising:
   positioning the stator at a predetermined position by a conveyor provided on a frame;
   applying a first driving control signal to a driver by a controller, and moving clamp terminals to a predetermined position corresponding to stator terminals;
   photographing the stator terminals of the stator and outputting vision data to the controller; and
   analyzing, by the controller, the vision data to calculate position data of the clamp terminals, applying a second driving control signal corresponding to the position data to the driver, and moving the clamp terminals according to the position data,
   wherein the driver comprises three servomotors orthogonal to each other that perform one dimensional movement operations in a plurality of directions relative to the frame for each clamp terminal.

12. The method of claim 11, wherein:
   the stator terminals are clamped by the clamp terminals;
   power is applied to the stator terminals through the clamp terminals; and
   an electrical circuit of the stator is inspected by an inspection portion.

13. The method of claim 12, wherein an inspection result is stored in the inspection portion, and wherein the inspection result is transmitted to a main control unit.

14. The method of claim 11, wherein in the positioning of the stator, a barcode attached to the stator is scanned with a barcode scanner, and product information of the stator is output to the controller.

15. The method of claim 11, wherein in the positioning of the stator,
   the stator conveyed by a conveyor is detected by a stator detecting sensor, and a detection signal is output to the controller, and
   the conveyor is stopped by the controller according to the detection signal.

16. The method of claim 11, wherein in the positioning of the stator, the stator is fixed to the conveyor by attachment members mounted on a base member on the conveyor.

* * * * *